United States Patent [19]

Lin et al.

[11] Patent Number: 5,587,945
[45] Date of Patent: Dec. 24, 1996

[54] CMOS EEPROM CELL WITH TUNNELING WINDOW IN THE READ PATH

[75] Inventors: Jonathan Lin, Milpitas; Jack Z. Peng, San Jose; Radu Barsan, Cupertino; Sunil Mehta, San Jose, all of Calif.

[73] Assignee: Advanced Micro Devices, Inc., Sunnyvale, Calif.

[21] Appl. No.: 554,092

[22] Filed: Nov. 6, 1995

[51] Int. Cl.$^6$ .................................................. G11C 16/02
[52] U.S. Cl. .................. 365/185.1; 365/185.18; 365/185.26; 326/45
[58] Field of Search .................... 365/185.1, 185.18, 365/185.26; 326/44, 45

[56] References Cited

U.S. PATENT DOCUMENTS

| | | | |
|---|---|---|---|
| 4,829,203 | 5/1989 | Ashmore, Jr. | 365/185.1 |
| 4,858,185 | 8/1989 | Kowshik et al. | 365/185.07 |
| 4,862,019 | 8/1989 | Ashmore, Jr. | 365/185.23 |
| 4,866,307 | 9/1989 | Ashmore, Jr. | 365/185.1 |
| 4,885,719 | 12/1989 | Brahmbhatt | 365/185.17 |
| 5,148,391 | 9/1992 | Zagar | 365/96 |
| 5,170,373 | 12/1992 | Doyle et al. | 365/185.17 |
| 5,270,587 | 12/1993 | Zagar | 326/50 |
| 5,272,368 | 12/1993 | Turner et al. | 365/185.1 |
| 5,404,328 | 4/1995 | Takemae | 365/185.1 |

*Primary Examiner*—David C. Nelms
*Assistant Examiner*—Andrew Q. Tran
*Attorney, Agent, or Firm*—Fliesler, Dubb, Meyer & Lovejoy

[57] ABSTRACT

A CMOS memory cell including PMOS and NMOS transistors with a common floating gate. The CMOS memory cell includes a first capacitor connecting a first control voltage to the common floating gate and a second tunneling capacitor connected from the common floating gate to the source of the NMOS transistor. The tunneling capacitor includes a tunneling oxide region utilized to charge or discharge the floating gate during program or erase. The CMOS cell further includes a pass transistor with a source to drain path connecting the source of the NMOS transistor to a second control voltage.

6 Claims, 5 Drawing Sheets

CMOS EEPROM CELL WITH TUNNELING WINDOW IN THE READ PATH

BACKGROUND OF THE INVENTION

1. Field of the Invention

The present invention relates to circuitry for a programmable CMOS memory cell, the CMOS memory cell having PMOS and NMOS transistors with a common floating gate. More particularly, the present invention relates to such programmable CMOS memory cells which can be utilized in a programmable logic device (PLD).

2. Description of the Related Art

FIG. 1 illustrates a first type conventional CMOS memory cell having a PMOS transistor 102 and an NMOS transistor 104 with a common floating gate. The first type CMOS cell includes two capacitors 106 and 108 which are utilized to program and erase the common floating gate. Capacitor 106 supplies voltage from an array control gate (ACG) node. An NMOS pass transistor 110 supplies a word control (WC) voltage to capacitor 108 as controlled by a word line (WL) voltage supplied to its gate.

Further, in the first type cell of FIG. 1, drains of transistors 102 and 104 are connected together to form an output. Bias voltage is provided to the source of PMOS transistor 102 from a chip Vcc pin. Bias voltage is provided to the source of the NMOS transistor 104 through a chip ground or Vss pin. The CMOS memory cell of FIG. 1 is disclosed in U.S. Pat. No. 5,272,368 entitled "Complementary Low Power Non-Volatile Reconfigurable EECELL," and in U.S. Pat. No. 4,885,719 entitled "Improved Logic Cell Array Using CMOS E²PROM Cells."

FIG. 2 shows a layout for the first type CMOS cell of FIG. 1 as formed in a p type substrate. In the layout, capacitor 106 includes an n+ type program junction implant region 202 formed in the p substrate. Separating the n+ type implant region 202 from the common floating gate (F.G.) 204 is an oxide layer approximately 150 Å thick. Capacitor 108 includes an n+ program junction implant region 206 formed in the p type substrate. Overlying the n+ type implant region 206 is the floating gate 204 which is separated from the implant region 206 by a gate oxide which includes a 150 Å portion and a 85 Å tunneling portion 208. The 85 Å tunneling portion 208 enables charge to be applied to the floating gate 204 during program and removed during erase.

Further, in the CMOS cell of FIG. 1, transistor 110 is formed by a polysilicon (POLY) word line (WL) region on the substrate with a portion of the WL region adjacent the n+ implant region 206 and another portion adjacent an additional n+ implant region 210. Transistor 104 includes two n+ implant regions 212 and 214 in the p substrate. A gate oxide region of approximately 150 Å separates a channel between regions 212 and 214 from the common floating gate 204. Transistor 102 includes two p type regions 216 and 218 in a n+ type well 220 which is included in the p type substrate. A gate oxide region of approximately 150 Å separates the channel between regions 216 and 218 from the common floating gate 204.

Typical voltages applied for program, erase and read of the CMOS memory cell of FIG. 1 are listed in Table I below.

TABLE I

|  | WC | WL | ACG | Vcc | Vss |
| --- | --- | --- | --- | --- | --- |
| Program | Vpp | Vpp+ | 0 | 0 | 0 |
| Erase | 0 | Vcc | Vpp+ | Vpp | Vpp |
| Read | Vcc/2 | Vcc | Vcc/2 | Vcc | 0 |

In Table I, as well as subsequent tables, programming indicates electrons are removed from the common floating gate, while erase indicates that electrons are added to the common floating gate. Further, Vpp indicates a programming voltage, typically of 12 volts. Vpp+ indicates the Vpp voltage plus an n channel threshold, typically totaling 13.8 volts. Finally, Vcc indicates a chip power supply pin voltage, typically of 5 volts.

FIG. 3 shows a second type CMOS memory cell design including a PMOS transistor 302 and an NMOS transistor 304 with a common floating gate. Unlike the capacitors 102 and 104 utilized in the first type CMOS memory cell of FIG. 1, the second type CMOS cell utilizes capacitor 306 and tunneling oxide regions in transistors 302 and 304 for program and erase. The capacitor 306 is connected between an array control gate (ACG) node and the common floating gate.

Further, in the CMOS cell of FIG. 3, the drains of transistors 302 and 304 are connected together to form the CMOS cell output. An additional PMOS pass gate transistor 310 has a drain connected to the source of PMOS transistor 302, a source connected to receive a word control (WC) voltage and a gate connected to receive a word line (WL) voltage.

FIG. 4 shows the layout for the cell of FIG. 3. As with the layout of FIG. 2, the capacitor 306 includes an n+ type program junction implant region 402 formed in the p type substrate. Separated from the n+ type implant region 402 by a 150 Å thick gate oxide region is the common floating gate (F.G.) 406. The tunneling oxide windows 430 and 432 of approximately 85 Å are provided between the floating gate 406 and the channel regions of respective transistors 302 and 304. The remaining regions of the common floating gate 406 are separated from the substrate by a 185 Å oxide layer. The channel region of the NMOS transistor 304 is formed between its n+ source and drain implant regions 410 and 412. The channel region of the PMOS transistor 302 is formed in an n+ well between p+ implant regions 414 and 416. The PMOS pass transistor 310 is formed in the same n+ well as transistor 302, using the n+ implant region 416 as its source, an additional implant region 418 as its drain, and a polysilicon wordline (WL) forming its gate.

Voltages applied to the CMOS memory cell of FIG. 3 during program, erase and read are listed in Table II below.

TABLE II

|  | WC | WL | ACG | Vss |
| --- | --- | --- | --- | --- |
| Program | Vpp | Vcc | 0 | Hiz |
| Erase | Hiz | 0 | Vpp | 0 |
| Read | Vcc | 0 | Vcc/2 | 0 |

With the second type CMOS memory cell programmed through the tunneling window of PMOS transistor 302, current leakage can occur to cause a disturb condition. Such a disturb condition occurs where electrons are injected onto the common floating gate in a CMOS cell which is not to be programmed. The current leakage during programming can occur because of charge storage in a large n well in which the PMOS transistors 302 and 310, as well as PMOS transistors of other CMOS cells are formed. A single n well is typically shared by a column of cells which all receive the same voltage WC during programming of a particular cell in the column. During programming a particular cell, a WL voltage of Vcc is applied, but in cells not to be programmed, a WL voltage of Vpp+is applied. The Vpp+WL voltage is applied to assure that the source of the PMOS transistors of unselected cells are floating, floating indicating a high impedance (Hiz) state. However, a large number of cells in an array will require a long Vss line, the long Vss line then having a significant capacitive component, enabling charge storage. By connecting the source of NMOS transistors of unselected cells in a column to the Vss line, a current flow can occur to charge up the capacitance of the Vss line so that drains of NMOS transistors and thus corresponding PMOS transistors are not floating. With the drain of an NMOS transistor not floating, electrons may be injected onto the floating gate in the unselected cells creating a disturb condition.

To avoid such a disturb condition, an additional NMOS transistor 500 can be added to the CMOS memory cell of FIG. 3, as shown in FIG. 5. Transistor 500 enables disconnection of the source of NMOS transistor 304 from the Vss line during programming to prevent a disturb condition. Such a CMOS memory cell is described in more detail in U.S. patent application Ser. No. 08/447,991, entitled "A Completely Complementary MOS Memory Cell With Tunneling Through The NMOS and PMOS Transistor During Program And Erase, filed May 23, 1995. Although the additional transistor 500 does help prevent a disturb condition, maintaining the drain of PMOS transistor 302 floating remains difficult, making a disturb condition likely.

FIG. 6 shows a programmable memory cell most commonly used in PLDs. The memory cell of FIG. 6 is manufactured similar to the first type cell of FIG. 1, with two capacitors 606 and 608 to control programming of a floating gate. The floating gate, however, is coupled only to a single transistor 604. As with the transistor 110 of FIG. 1, transistor 610 is utilized to apply voltages to capacitor 608. The gate voltage of transistor 610 is also applied to an additional NMOS transistor 602.

Because the cells of FIGS. 1 and 3 do not include a means to create a separate enable or disable, unlike the cells of FIGS. 5 and 6, their circuitry is not practical for use with a PLD. To illustrate, FIG. 7 shows the connections of two array cells 701 and 702 in a PLD. As shown, each array cell 701 and 702 receives an input signal COL1 and COL2 as an enable signal EN. Each of cells 701 and 702 further has one connection to a product term (PT) line and an additional connection to a product term ground (PTG) line. The PT line forms an input to a buffer 712 included in a sense amplifier 710. The PTG line provides a connection to Vss in the sense amplifier 710. The sense amplifier 710 also includes a current source 714 connected to the input of the buffer 312. Array cells 701 and 702 are programmed to provide a connection from the PT to the PTG line, the connection being provided when the array cell receives an appropriate EN signal.

By connecting the output of the cell of either FIGS. 1 or 3 to the PT line and its corresponding Vss connection to the PTG line, programming can provide a path between its output and Vss. However, no separate enable (EN) is provided. With the PT and PTG lines connected in FIG. 6 and the WL connection providing an enable, the cell of FIG. 6 is usable in a PLD. Similarly, with the output of the CMOS cell of FIG. 5 connected to the PT line, its Vss connection connected to the PTG line, and the gate of transistor 500 receiving the enable (EN) signal, the circuit of FIG. 5 can be used in a PLD. Unlike the cell of FIG. 6, a CMOS memory cell of FIG. 5 is advantageous because it enables zero power operation, zero power operation indicating that the component does not continually draw power when the component is not changing states.

SUMMARY OF THE INVENTION

The present invention provides a CMOS memory cell which can be utilized in a PLD.

The present invention further provides a CMOS memory cell more compatible to current technology used in PLDs than the second type cells which include tunneling windows in the NMOS and PMOS transistors of the CMOS cell.

The present invention further does not have the potential disturb condition of the second type cells.

The present invention is a CMOS memory cell including PMOS and NMOS transistors with a common floating gate. The CMOS memory cell of the present invention includes a first capacitor connecting the floating gate to an ACG node as with cell 106 of FIG. 1. The CMOS cell of the present invention further includes a second tunneling capacitor having a first end connected to the floating gate, similar to the first type CMOS cell of FIG. 1. Unlike the CMOS cell of FIG. 1, the second end of the tunneling capacitor is also connected to the source of the NMOS transistor which shares the common floating gate. Further, like the first type CMOS cell of FIG. 1, the CMOS cell of the present invention includes an NMOS pass transistor to supply a word control (WC) voltage to the second end of the tunneling capacitor as controlled by a word line (WL) voltage applied to its gate.

BRIEF DESCRIPTION OF THE DRAWINGS

Further details of the present invention are explained with the help of the attached drawings in which.

DETAILED DESCRIPTION

Figure 8:
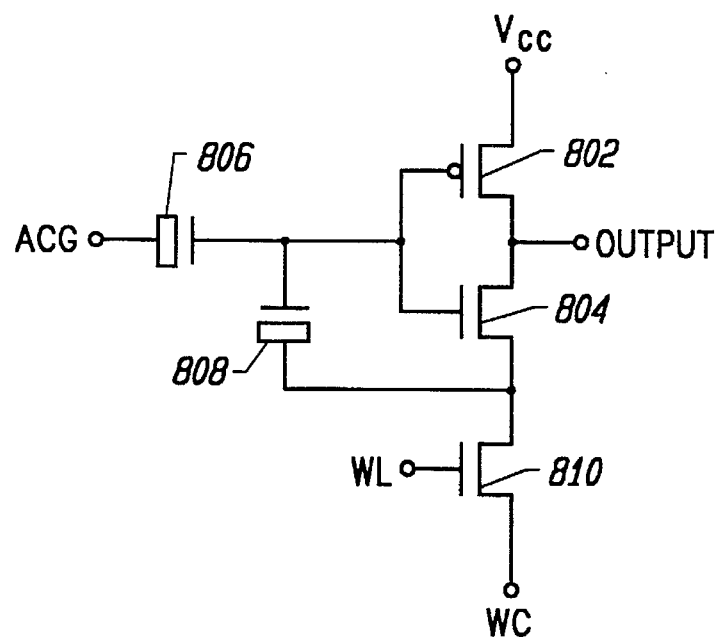
FIG. 8 illustrates a CMOS memory cell of the present invention.

FIG. 8 illustrates a CMOS memory cell of the present invention. The CMOS memory cell includes a PMOS transistor 802 and an NMOS transistor 804 having a common floating gate. Similar to the first type memory cell shown in FIG. 1, the CMOS memory cell of FIG. 8 includes a tunneling capacitor 808 having a tunneling window used to add or subtract charge to the common floating gate during program or erase. The tunneling capacitor has a first end connected to the common floating gate and a second end connected to the drain of a pass gate 810. As in FIG. 1, the pass gate 810 has a source connected to a word control (WC) voltage node, and a gate connected to a word line (WL) voltage node. Further, as with the cell of FIG. 1, FIG. 8 includes a capacitor 806 coupling an array control gate (ACG) node to the common floating gate. The drains of transistor 802 and 804 are connected together to form an output node.

Figure 1:
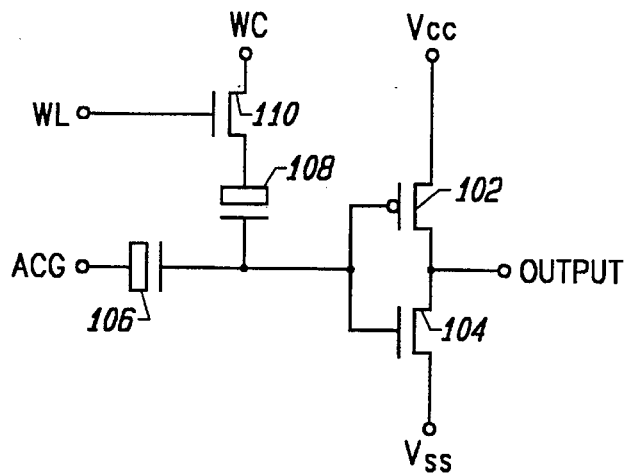
FIG. 1 illustrates a first configuration of a first type conventional CMOS memory cell.
Figure 2:
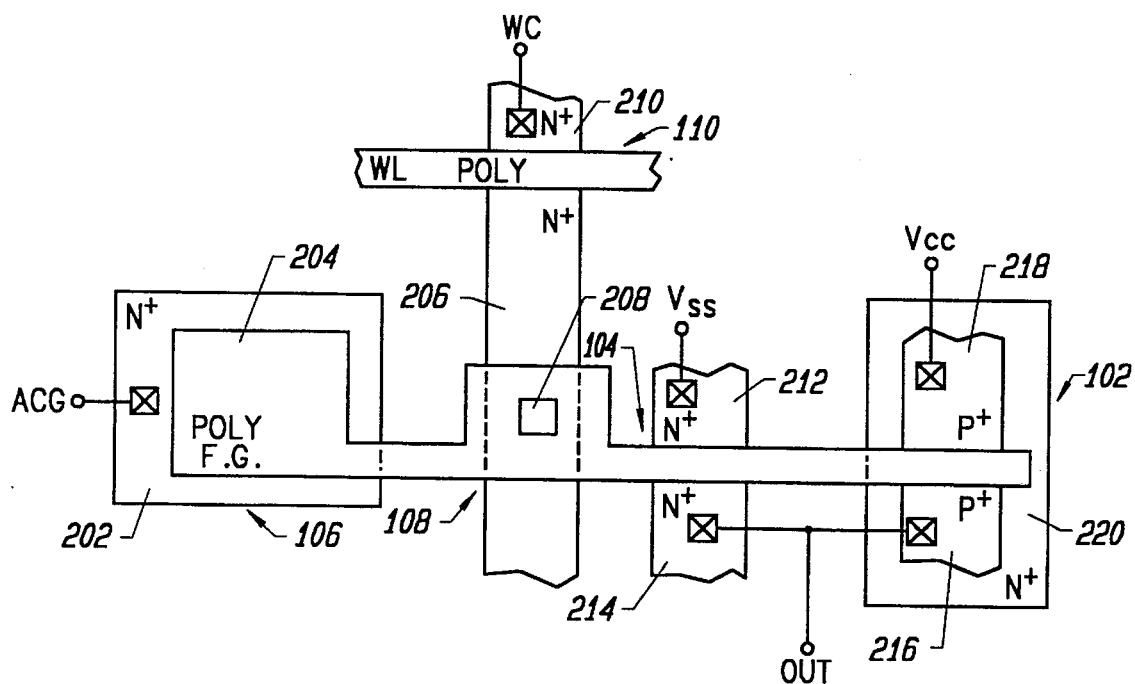
FIG. 2 shows the layout for the CMOS memory cell of FIG. 1.
Figure 7:
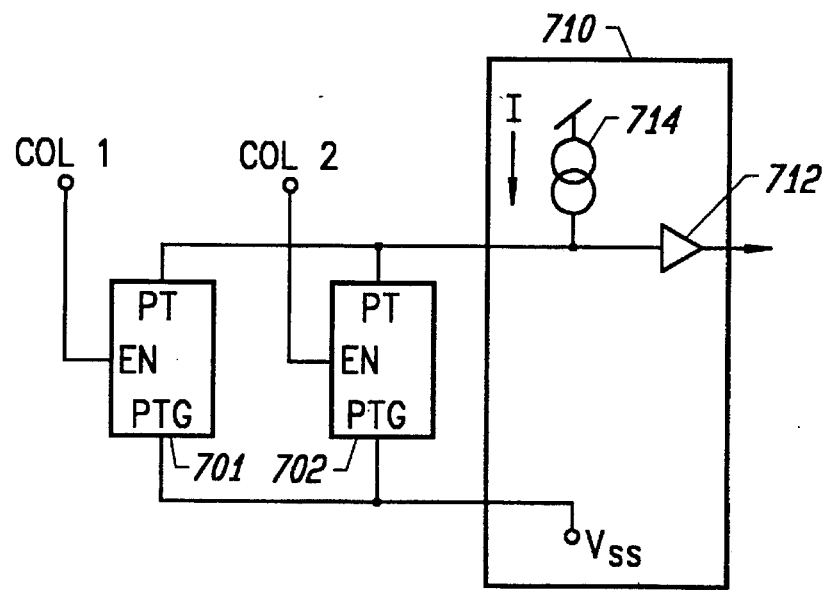
FIG. 7 shows the connections of two array cells in a PLD.

Unlike the circuit of FIG. 1, the second end of capacitor 808 which is connected to the drain of NMOS pass transistor 810 is also connected to the source of NMOS transistor 804. With the connection of the source of NMOS transistor 804 to the pass transistor 810, by connecting the output node to a PT line, the WC node to a PTG line, and the WL node to receive an enable signal, the CMOS cell of FIG. 8 can be utilized as a cell in a PLD configured as shown in FIG. 7.

Figure 9:
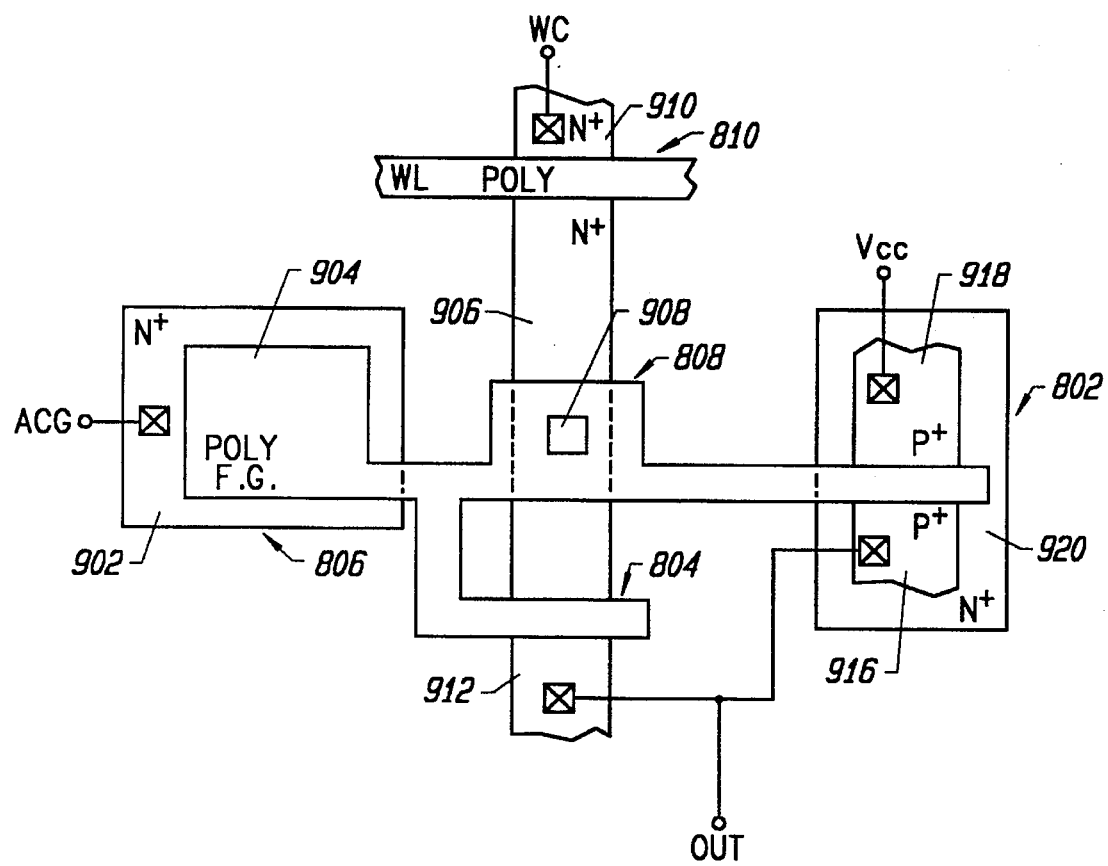
FIG. 9 shows the layout for the circuit of FIG. 8.

FIG. 9 shows the layout for the circuit of FIG. 8. In the layout, capacitor 806 includes an n+ type program junction implant region 902 formed in the p substrate. Separating the n+ type implant region 902 from the common floating gate (F.G.) 904 is an oxide layer approximately 150 Å thick. A contact connected to the n+ implant region 902 provides a connection to the ACG node.

Capacitor 808 includes an n+ program junction implant region 906 formed in the p type substrate. Overlying the n+ type implant region 906 is the floating gate 904 which is separated from the implant region 906 by a gate oxide which includes a 150 Å portion and a 85 Å tunneling portion 908. The 85 Å tunneling region 908 enables charge to be applied to the floating gate 904 during program and removed during erase.

Further in the CMOS cell of FIG. 1, transistor 810 is formed by a polysilicon (POLY) word line (WL) region on the substrate with a portion of the WL region adjacent the n+ implant region 906 and another portion adjacent an additional n+ implant region 910. A contact region provided in the n+ implant region 910 provides a connection to the WC node.

Transistor 804 shares the n+ implant region 906 of capacitor 808 and includes an additional n+ implant region 912. A gate oxide region of approximately 150 Å separates a channel between regions 906 and 912 from the common floating gate 904. A contact connected to region 912 provides a connection to an output node.

Finally, transistor 802 includes two p type regions 916 and 918 in a n+ type well 920 which is included in the p type substrate. A gate oxide region of approximately 150 Å separates the channel between regions 916 and 918 from the common floating gate 904. A contact connected to region 916 provides a connection to an output node. A contact to region 918 provides a connection to Vcc.

Voltages applied during program, erase and read for the CMOS memory cell of FIG. 8 are listed in Table III below.

TABLE III

|  | WC | WL | ACG | Vcc |
| --- | --- | --- | --- | --- |
| Program | Vpp | Vpp+ | 0 | Hiz |
| Erase | 0 | Vcc | Vpp+ | Hiz |
| Read | 0 | Vcc | Vcc/2 | Vcc |

Voltages applied to the circuitry of FIG. 8 are altered from voltages applied with the circuitry of FIG. 1 to account for the connection of one end of capacitor 808 and the source of the NMOS transistor 804 to the drain of NMOS pass transistor 810.

Figure 3:
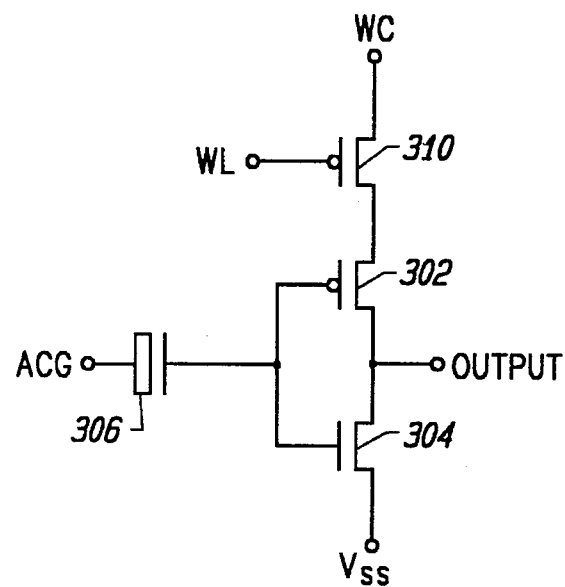
FIG. 3 shows circuitry for a second type CMOS memory cell.
Figure 4:
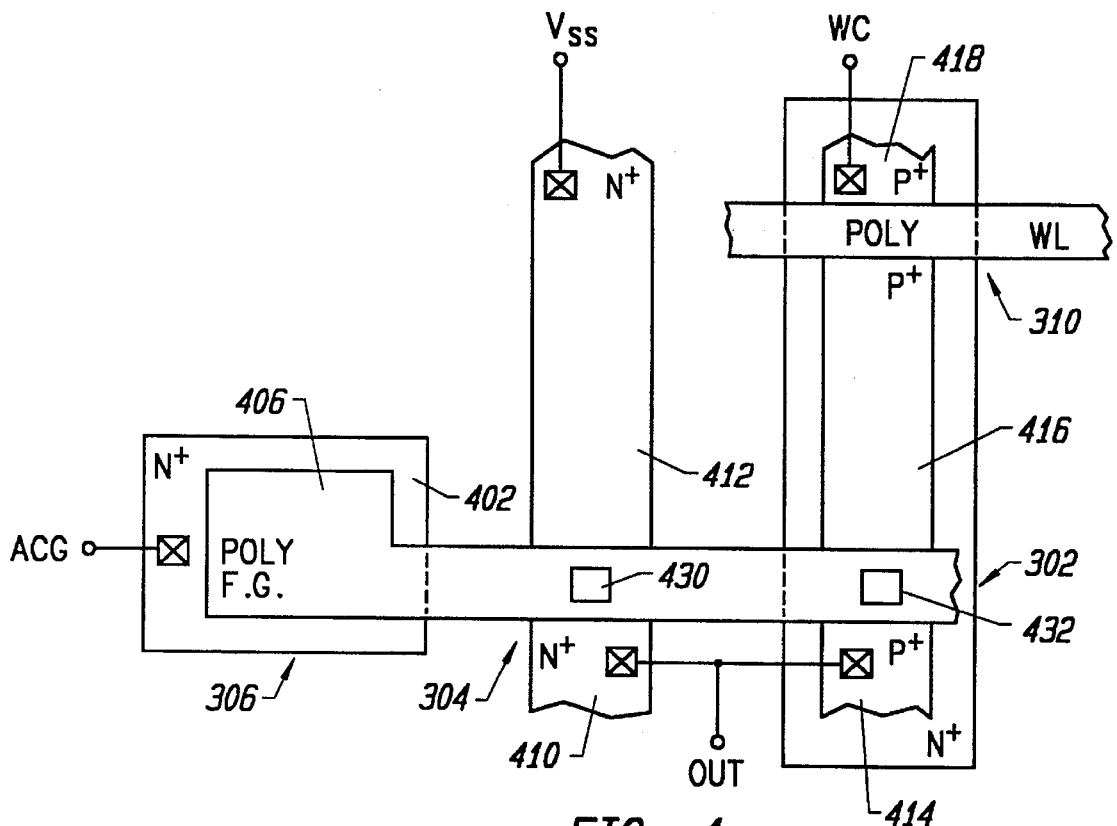
FIG. 4 shows the layout for the CMOS cell of FIG. 3.
Figure 5:
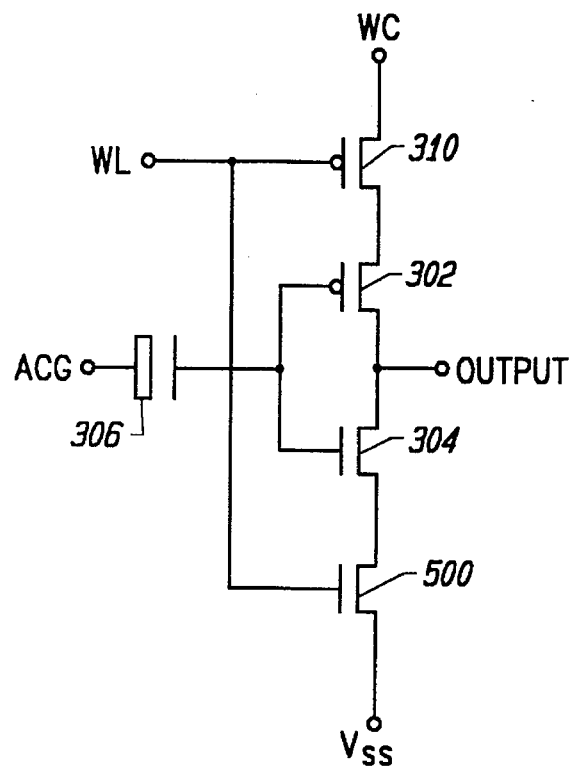
FIG. 5 shows the CMOS cell of FIG. 4 with an additional transistor added to prevent a disturb condition.
Figure 6:
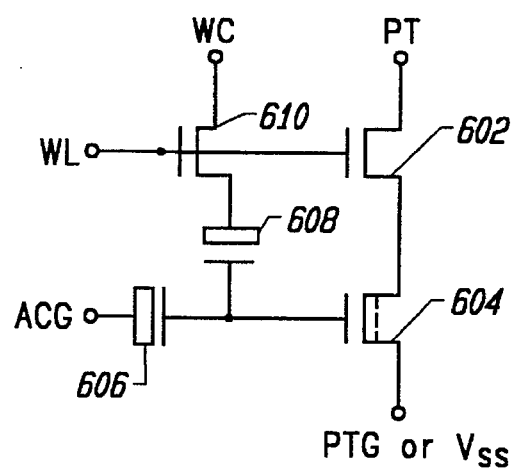
FIG. 6 shows a conventional programmable memory cell most commonly used in PLDs.

During programming with the circuit of FIG. 1, Vcc was set to zero and the source of the NMOS transistor, or Vss was set to zero. In the circuit of FIG. 8 Vpp, typically being 12 V, must be applied to one end of capacitor 808 to enable programming. Vpp is thus, likewise applied to the source of transistor 804 during programming. Since programming occurs through a tunneling region of capacitor 808, instead of through a common floating gate of PMOS and NMOS transistors as in the second type cell of FIG. 3, voltages on the PMOS and NMOS cells are not as critical during programming. Thus, with the source of the NMOS transistor 804 at Vpp, the source of PMOS transistor 802 can be floating, or at a high impedance (Hiz) level and programming still occur. The Hiz level is used instead of at a zero volt level for Vcc as in FIG. 1 because with Vcc at zero volts, a path would be created to ground from the source of the NMOS transistor 804 which would drain the power supply providing the programming voltage Vpp.

During erase with the circuit of FIG. 1, Vcc was set to Vpp and the source of the NMOS transistor, or Vss was set to Vpp. Such voltages were previously applied to prevent current leakage through the PMOS and NMOS transistors of a CMOS cell. In the circuit of FIG. 8, to enable erase, the end of capacitor 808 connected to the source of NMOS transistor 804 must be set to zero volts. By setting Vcc to Vpp, again, a path would be created between the Vpp power supply and ground which would overload the power supply. Thus, Vcc is set to a Hiz level for the circuit of FIG. 8 to prevent such a path to ground. Although with the source of the NMOS and PMOS less than Vpp as for erase in the circuit of FIG. 1, leakage might still occur, such leakage will not effectively prevent programming.

During read with the circuit of FIG. 8, the source of the NMOS transistor 804 must be maintained at zero volts. Thus, the voltage applied to capacitor 808 at the source of NMOS transistor 804 is likewise zero volts. During read, however, the voltage on the floating gate should be maintained at a voltage of approximately Vcc/2. To maintain the floating gate at Vcc/2, the ACG voltage is set at Vcc/2, or slightly higher.

With Vcc applied from a chip power supply pin, CMOS memory cells have previously not been considered practical because the threshold of the PMOS transistor, such as 802, is typically referenced to Vcc. With Vcc being a voltage supplied from an external source to the Vcc pin, unregulated variations in Vcc occur. Such variations in Vcc require that an unacceptably high voltage be applied to the common floating gate to assure PMOS transistor 802 can be turned off. Recently, it has been discovered that by applying a regulated voltage from a voltage reference to the source of PMOS transistor 802, rather than directly from Vcc, use of a CMOS memory cell becomes practical. U.S. patent application Ser. No. 08/426,741 entitled "Reference for CMOS Memory Cell Having PMOS and NMOS Transistors With a Common Floating Gate" filed Apr. 21, 1994, incorporated herein by reference, discloses such a reference for a CMOS memory cell.

Although the invention has been described above with particularity, this was merely to teach one of ordinary skill in the art how to make and use the invention. Many modifications will fall within the scope of the invention, as that scope is defined by the claims which follow.

What is claimed is:

1. A memory cell comprising:

a PMOS transistor having a drain forming an output node, a source and a channel between the source and drain underlying a common floating gate;

an NMOS transistor having a drain coupled to the output node, a source and a channel between the source and drain of the NMOS transistor underlying the common floating gate;

a capacitor having a first terminal forming a control gate and a second terminal coupled to the common floating gate;

a tunneling capacitor having a first terminal coupled to the common floating gate and a second terminal coupled to the source of the NMOS transistor.

2. The memory cell of claim 1 further comprising:

a pass transistor having a gate for receiving a word line (WL) select voltage, a drain coupled to the source of the NMOS transistor and a source for receiving a word control (WC) voltage.

3. The memory cell of claim 2 wherein the pass transistor is an NMOS transistor.

4. A method of programming the CMOS memory cell of claim 1, wherein programming results in electrons being removed from the common floating gate, programming comprising the steps of:

applying a voltage between the control gate and the second terminal of the tunneling capacitor so that electrons transfer from the common floating gate to the second terminal of the tunneling capacitor; and creating a high impedance at the source of the PMOS transistor.

5. A method of erasing the CMOS memory cell of claim 1, wherein erasing results in electrons being added to the common floating gate, erasing comprising the steps of:

applying a voltage between the control gate and the second terminal of the tunneling capacitor so that electrons transfer from the second terminal of the tunneling capacitor to the common floating gate; and creating a high impedance at the source of the PMOS transistor.

6. A programmable logic device (PLD) comprising:

a sense amplifier having a product term (PT) input and a product term ground (PTG) input;

a plurality of memory cells, each comprising:

a PMOS transistor having a drain coupled to the PT line, a source and a channel between the source and drain underlying a common floating gate;

an NMOS transistor having a drain coupled to the PT line, a source and a channel between the source and drain of the NMOS transistor underlying the common floating gate;

a capacitor having a first terminal forming a control gate and a second terminal coupled to the common floating gate;

a tunneling capacitor having a first terminal coupled to the common floating gate and a second terminal coupled to the source of the NMOS transistor; and a pass transistor having a drain connected to the source of the NMOS transistor, a source connected to the PTG line, and a gate forming an enable input.

* * * * *